US011342180B2

(12) United States Patent
Martin et al.

(10) Patent No.: US 11,342,180 B2
(45) Date of Patent: May 24, 2022

(54) PROCESS FOR EPITAXYING GALLIUM SELENIDE ON A [111]-ORIENTED SILICON SUBSTRATE

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); UNIVERSITE GRENOBLE ALPES, Saint Martin d'Heres (FR)

(72) Inventors: Mickaël Martin, Grenoble (FR); Thierry Baron, Saint-Egreve (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); UNIVERSITE GRENOBLE ALPES, Saint Martin d'Heres (FR)

( * ) Notice: Subject to any disclaimer, the term of this patent is extended or adjusted under 35 U.S.C. 154(b) by 64 days.

(21) Appl. No.: 17/063,378

(22) Filed: Oct. 5, 2020

(65) Prior Publication Data
US 2021/0111023 A1 Apr. 15, 2021

(30) Foreign Application Priority Data
Oct. 15, 2019 (FR) ...................................... 1911450

(51) Int. Cl.
*C30B 29/46* (2006.01)
*H01L 21/02* (2006.01)
(Continued)

(52) U.S. Cl.
CPC .... *H01L 21/02568* (2013.01); *C23C 16/0272* (2013.01); *C23C 16/305* (2013.01);
(Continued)

(58) Field of Classification Search
CPC ....... C30B 25/183; C30B 29/06; C30B 29/46; C23C 16/0272; C23C 16/305;
(Continued)

(56) References Cited

U.S. PATENT DOCUMENTS 5,039,626 A * 8/1991 Koma ...................... C30B 23/02
117/106
7,071,087 B2 * 7/2006 Yang .................. H01L 21/02381
438/603

(Continued)

OTHER PUBLICATIONS

Palmer, et al., "Layered Structure GaSe as a Thermal Lattice Mismatch Buffer Layer in the Gaas/ Siheteroepitaxial System", Extended Abstracts of the International Conference on Solidstate Devices and Materials, pp. 302-303, Aug. 1, 1992.

(Continued)

*Primary Examiner* — Robert M Kunemund
(74) *Attorney, Agent, or Firm* — BakerHostetler (57) ABSTRACT

A process for epitaxying GaSe on a [111]-oriented silicon substrate, includes a step of selecting a [111]-oriented silicon substrate resulting from cutting a silicon bar in a miscut direction which is one of the three [11-2] crystallographic directions, the miscut angle (α) being smaller than or equal to 0.1°, the obtained surface of the substrate forming a vicinal surface exhibiting a plurality of terraces and at least one step between two terraces; a passivation step consisting of depositing an atomic bilayer of gallium and of selenium on the vicinal surface of the silicon substrate so as to form a passivated vicinal surface made of silicon-gallium-selenium (Si—Ga—Se), said passivated vicinal surface exhibiting a plurality of passivated terraces and at least one passivated step between two passivated terraces; a step of forming a layer of two-dimensional GaSe by epitaxy on the passivated surface, said formation step comprising a step of nucleation from each passivated step and a step of lateral (Continued)

growth on the passivated terraces from the nuclei obtained in the nucleation step. A structure obtained by means of the epitaxying process is also provided.

15 Claims, 5 Drawing Sheets

(51) Int. Cl.
    *C23C 16/02*     (2006.01)
    *C23C 16/30*     (2006.01)
    *C30B 25/18*     (2006.01)
    *C30B 29/06*     (2006.01)

(52) U.S. Cl.
    CPC ............ *C30B 25/183* (2013.01); *C30B 29/06* (2013.01); *C30B 29/46* (2013.01); *H01L 21/0243* (2013.01); *H01L 21/0262* (2013.01); *H01L 21/02381* (2013.01); *H01L 21/02433* (2013.01); *H01L 21/02485* (2013.01); *H01L 21/02598* (2013.01)

(58) Field of Classification Search
    CPC ........... H01L 21/02381; H01L 21/0243; H01L 21/02433; H01L 21/02485; H01L 21/02598; H01L 21/0202
    See application file for complete search history.

(56) References Cited

U.S. PATENT DOCUMENTS

| | | | |
|---|---|---|---|
| 8,415,187 B2* | 4/2013 | Fritzemeier | H01L 21/02516 438/46 |
| 2016/0233322 A1* | 8/2016 | Yeh | H01L 21/02565 |
| 2017/0073809 A1* | 3/2017 | Choi | C23C 14/0021 |

OTHER PUBLICATIONS

Vinh, et al.,"Heteroepitaxy of GaSe layered semiconductor compound on Si(111)7×7 substrate: a Van der Waals epitaxy?", Journal of Crystal Growth, vol. 135, Issue 1, p. 1-10, Jan. 1, 1994.

\* cited by examiner

Bottom view

Side view

PROCESS FOR EPITAXYING GALLIUM SELENIDE ON A [111]-ORIENTED SILICON SUBSTRATE

CROSS-REFERENCE TO RELATED APPLICATIONS

This application claims priority to foreign French patent application No. FR 1911450, filed on Oct. 15, 2019, the disclosure of which is incorporated by reference in its entirety.

FIELD OF THE INVENTION

The field of the invention is that of the hetero-integration of semiconductor materials on silicon substrates, and relates more specifically to the epitaxying of two-dimensional gallium selenide (2D GaSe) with a single orientation on [111]-oriented silicon substrate, which may be denoted by Si(111).

Among the numerous applications of the invention, mention may be made of microelectronics, photonics, sensors, radiofrequency-related technologies, microsystems (MEMS), components for the Internet of Things and more broadly anything to do with "more-than-Moore" applications or what are referred to as "derivative" technologies, that is to say technologies which incorporate several functions on a single silicon chip.

BACKGROUND

Silicon (Si) is the semiconductor at the foundation of micro-nanoelectronics. Its highly mature technology for the manufacture of integrated circuits (IC) has experienced impressive progress in terms of miniaturization and improvement of performance.

However, other semiconductors exhibit complementary (electronic, optical, mechanical, etc.) properties which may be advantageous to implement on silicon-based chips.

In this context, a novel class of materials has recently come into being: "2D materials". What is meant by "2D material" is a material consisting of a sheet (or of a stack of sheets) a few atoms thick. The term "two-dimensional" material is also used. These materials are electronically saturated, so the stacking of several of these sheets takes place via van der Waals bonding. Among the 2D materials, some are semiconductors. Their very low thickness gives rise to quite unique electronic, optoelectronic and mechanical properties. A material which is not structured as one or more sheets but has ionic or covalent bonds throughout its volume may also be referred to as a "3D material", for example a traditional semiconductor material.

The monolithic hetero-integration of 2D materials by epitaxying on a silicon substrate is a very promising avenue for adding novel (electronic, optical, photonic, mechanical, biological, etc.) functionalities to CMOS (complementary metal-oxide-semiconductor) integrated circuits of highly mature silicon-based technology. It also makes it possible to overcome the troublesome issue of dislocations in the crystal lattice of more conventional (Ge, GaN, etc.) semiconductors epitaxied on silicon.

Among all 2D materials, gallium selenide, GaSe, is a is a very interesting material for epitaxying on a [111]-oriented silicon substrate in that the dangling bonds on the silicon surface may be passivated electronically by an atomic layer of gallium (Ga) and an atomic layer of selenium (Se) in order to form a stable and electronically passivated Si—Ga—Se interface that allows the subsequent growth of the two-dimensional GaSe material (referred to as "2D GaSe") by van der Waals epitaxy. The atomic bilayer of gallium and of selenium may be formed by using the technique of molecular beam epitaxy (MBE) which consists in projecting one or more molecular beams towards the substrate.

The expression "electronically passivated", or "electronic passivation", means removing dangling bonds (or reactive Si—H bonds in a hydrogen-containing environment). The expression "electronically saturated surface" may also be used.

An atomic layer of gallium thus bonded to an atomic layer of selenium may be referred to as an "atomic bilayer" and may be seen as a half-sheet of the "2D GaSe" material. Specifically, 2D GaSe refers to two-dimensional gallium selenide (as a sheet) made up of four atomic layers in the sequence Se—Ga—Ga—Se.

Figure 1A:
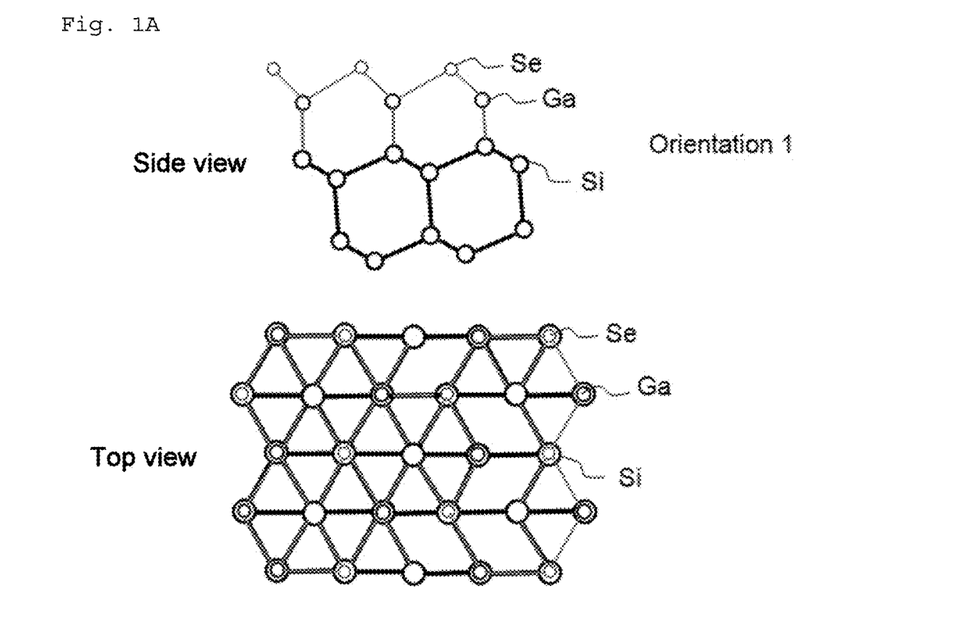
FIG. 1A and FIG. 1B illustrate an Si—Ga—Se surface with two opposing orientations.
Figure 1B:
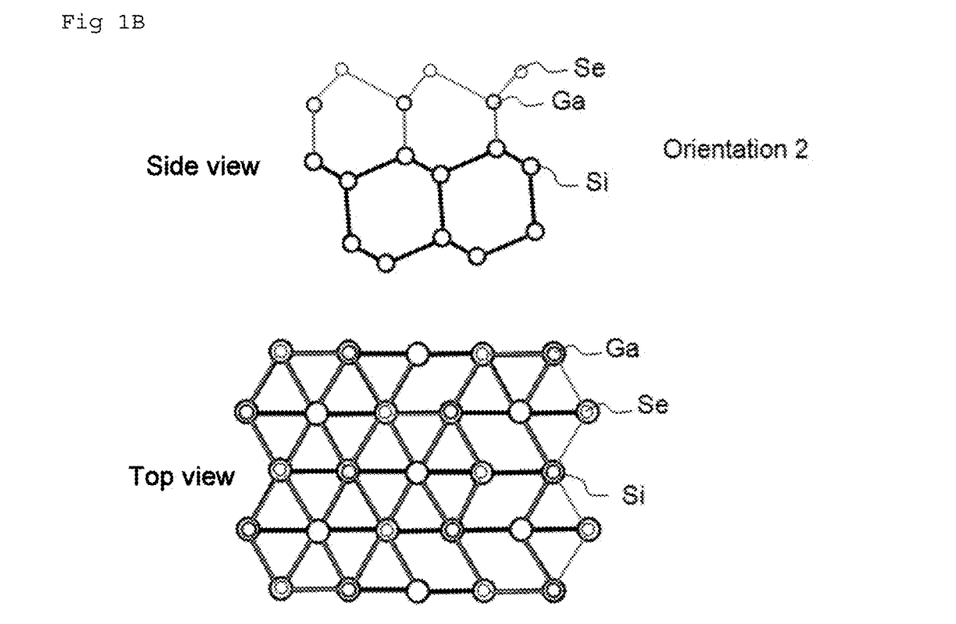

However, the formation of the Si—Ga—Se interface may result in a surface with two types of domains which are mirror images of one another, resulting in an antiphase defect as illustrated in FIGS. 1A (orientation 1) and 1B (orientation 2).

Figure 2:
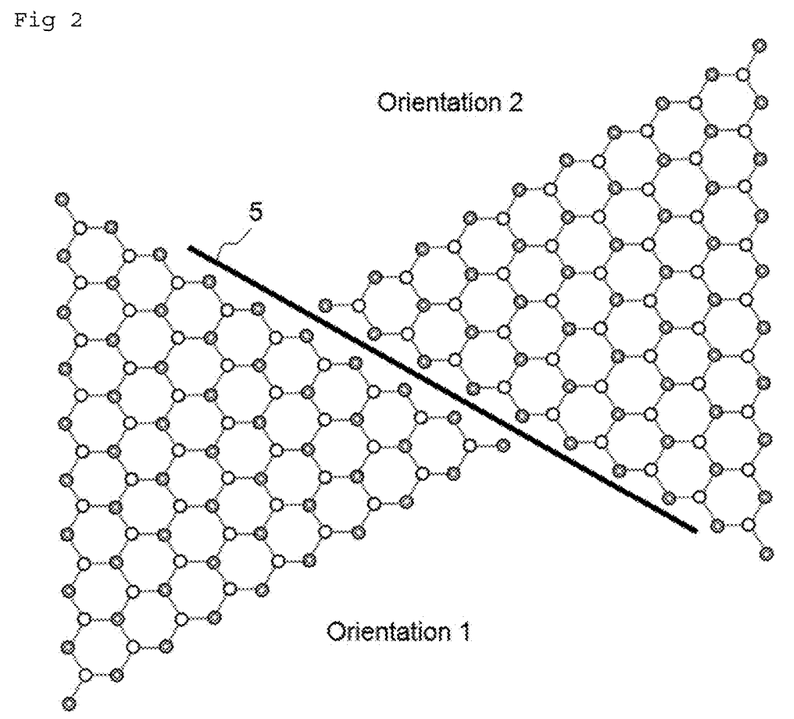
FIG. 2 illustrates the formation of grains of 2D GaSe with two orientations at 180° with respect to one another.

The subsequent epitaxial growth of the 2D GaSe material on this Si—Ga—Se interface, and more specifically on this surface with mirroring domains 5, may also result in the formation of grains of GaSe with two orientations at 180° with respect to one another, as illustrated in FIG. 2. As these grains of GaSe coalesce, crystal defects will form (grain boundaries), and these crystal defects may harm the optical, electronic, thermal and mechanical properties of the 2D GaSe material.

In general, the techniques for growing 2D GaSe used in the prior art are sensitive to the different orientations of the passivated Si(111) surface. The layers of 2D GaSe thus obtained thus always contain two types of domains, mirror images of one another, separated by grain boundaries, resulting in crystal defects.

SUMMARY OF THE INVENTION

The invention aims to provide a process for epitaxying gallium selenide on a [111]-oriented silicon substrate without the aforementioned drawbacks of the prior art.

More particularly, it aims to provide a process for epitaxying 2D gallium selenide on a [111]-oriented silicon substrate which makes it possible to decrease the defects generated at the interface between said silicon substrate and said epitaxied layer of 2D GaSe, in particular to decrease the formation of antiphase boundaries, and which is industrially applicable, that is to say straightforward to implement on a large scale (200 and 300 mm substrate) and with a high manufacturing yield.

A process allowing these drawbacks to be overcome is a process for epitaxying GaSe on a [111]-oriented silicon substrate, characterized in that it comprises:

a step of selecting a [111]-oriented silicon substrate, said substrate resulting from cutting a silicon bar in a miscut direction which is one of the three [11-2] crystallographic directions, the miscut angle being smaller than or equal to 0.1°, the obtained surface of the substrate forming a vicinal surface exhibiting a plurality of terraces and at least one step between two terraces;

a passivation step consisting of depositing an atomic bilayer of gallium and of selenium on the vicinal surface of the silicon substrate so as to form a passivated vicinal surface made of silicon-gallium-selenium, said passivated vicinal surface exhibiting a plurality of passivated terraces and at least one passivated step between two passivated terraces;

a step of forming a layer of two-dimensional GaSe by epitaxy on the passivated vicinal surface, said formation step comprising a step of nucleation from each passivated step and a step of lateral growth on the passivated terraces from the nuclei obtained in the nucleation step.

The expression "miscut angle being smaller than or equal to 0.1°" is understood to mean that the absolute value of the miscut angle is smaller than or equal to 0.1°, in other words the miscut angle is between −0.1° and +0.1°, the values −0.1° and +0.1° included.

The expression "lateral growth" is understood to mean that each nucleus grows from the step in an opposite direction to said step and along the main plane of the terrace.

The process combines precisely selecting an Si(111) substrate which has been cut according to precise specifications, allowing a vicinal surface to be obtained, with conditions for epitaxially growing the GaSe that allow preferential nucleation of the 2D GaSe by alignment from the steps on the vicinal surface.

A vicinal surface is a surface on which the atoms are no longer distributed in a plane but are organized in a set of regularly spaced steps whose height is a multiple of the distance between two successive planes of atoms in the crystal lattice of the material. This surface appears as a succession of terraces and steps between the terraces. The steps are ideally rectilinear and parallel, depending on the conditions under which the material was cut.

The process thus comprises the selection of a [111]-oriented silicon substrate from a cylindrical bar of [111]-oriented silicon. The [111]-oriented face of the silicon is a dense plane. The vicinal surface of the substrate is obtained from said cylindrical bar of [111]-oriented silicon by cutting it along a crystal plane that is slightly misoriented with respect to the dense [111] plane, that is to say whose miscut angle is smaller than or equal to 0.1°.

The selection step may comprise a step of controlling these specifications for cutting the selected substrate. The step of controlling the substrate may comprise a step of measuring the substrate using X-ray diffraction which makes it possible to obtain the misorientation characteristics of the substrate.

The cut must be made so as to orient the direction of alignment of the steps, thus allowing the growth of the 2D GaSe to be determined by these steps in the step of forming the layer of 2D GaSe. This allows preferential nucleation of the 2D GaSe from the steps rather than within the terraces. Specifically, the orientation of the layer of 2D GaSe will be dictated by the direction of alignment of the steps.

In the step of forming the layer of 2D GaSe by epitaxy, for example during the nucleation step or thereafter, it is possible to add a step of controlling the alignment of the GaSe nuclei against the steps. This step of controlling the alignment may comprise a step of measurement using a high-resolution scanning transmission electron microscope (STEM) which makes it possible to check for the presence of covalent bonds of the GaSe atoms at the steps.

Ultimately, the combination of the step of selection and the step of formation of the layer of 2D GaSe makes it possible to obtain a layer of 2D GaSe of single orientation, making it possible to overcome the issue of the grain boundaries. This layer of 2D GaSe, with a very low rate of defects, may subsequently be used as an active layer for devices on silicon with novel (electronic, optoelectronic, mechanical, etc.) functionalities.

According to one embodiment, the process further comprises a step of treating the vicinal surface so as to flatten the terraces of said vicinal surface until a substantially zero roughness is obtained on the terraces, said treatment step being carried out after the substrate selection step and before the passivation step.

The treatment step may consist in heat-treating the silicon substrate at high temperature, preferably higher than 800° C. The pressure during the heat treatment is preferably lower than 600 Torr.

According to one embodiment, the passivation step consists of metal-organic chemical vapour deposition (MOCVD) with metal-organic precursors. In particular, the metal-organic precursors may be trimethylgallium (TMGa) and diisopropyl selenide (DIPSe). The partial pressure of TMGa is preferably between 1 and 200 mTorr. The passivation step is preferably carried out at a temperature of between 400 and 650° C. The passivation step is preferably carried out for a duration of between 2 and 30 seconds.

According to one embodiment, the nucleation step consists of metal-organic chemical vapour deposition with metal-organic precursors. The partial pressure of the gallium precursor is preferably lower than or equal to 50 mTorr. The nucleation step is preferably carried out at a temperature of between 400 and 650° C. The nucleation step is preferably carried out for a duration of between 2 and 30 seconds.

According to one embodiment, the lateral growth step consists of metal-organic chemical vapour deposition with metal-organic precursors. The partial pressure of the gallium precursor is preferably between 0.5 and 5 mTorr. The lateral growth step is preferably carried out at a temperature of between 570 and 650° C.

According to one embodiment, the process further comprises a step of removing the oxide from the vicinal surface, said deoxidation step being carried out after the substrate selection step and before the passivation step.

According to one embodiment, the process further comprises an additional step of epitaxying at least one 2D material other than 2D GaSe or at least one 3D semiconductor material, said additional step of epitaxy being formed on the layer of 2D GaSe.

Thus, the layer of 2D GaSe obtained by means of the process according to the invention may be used as a high-quality buffer layer for the subsequent growth of other materials, with moreover a low rate of defects. The at least one 2D material other than 2D GaSe or the at least one 3D material may be chosen from the III-VI materials such as InSe, GaS, GaTe or a combination of III-VI materials, the III-V materials such as GaN, InGaN, GaAs, GaSb or a combination of III-V materials, the II-VI materials such as CdHgTe or a combination of II-VI materials, or the IV-IV materials such as SiGe or Ge—Ge or a combination of IV-IV materials.

The process makes it possible to carry out epitaxy by advancing from each step of a vicinal surface of silicon Si(111) so as to obtain a layer of 2D GaSe of single orientation without grain boundaries.

The process ultimately makes it possible to achieve a single orientation of the 2D GaSe without antiphase defects, and to do so using an industrially applicable process that can be carried out on a large scale, with a high yield, in particular by means of MOCVD on a substrate compatible with standard micro/nanomanufacturing means of a silicon technological platform.

Another subject of the invention is the structure obtained by means of the epitaxying process, comprising:
  a [111]-oriented silicon substrate, the surface of which is a passivated vicinal surface exhibiting passivated terraces and at least one passivated step between two passivated terraces;

a layer of 2D GaSe formed on the passivated terraces, and exhibiting a single orientation without antiphase boundaries.

The miscut angle of the vicinal surface of the [111]-oriented silicon substrate is smaller than or equal to 0.1°.

Preferably, the [11-2] direction of the silicon surface is aligned with the [11-20] direction of the GaSe.

BRIEF DESCRIPTION OF THE DRAWINGS

Other features and advantages of the invention will become apparent through the description which follows by way of non-limiting illustration, given with reference to the appended figures, among which.

DETAILED DESCRIPTION

FIGS. 1A, 1B and 2 have been described already and will not be revisited here.

FIGS. 3A to 3G show an exemplary process for epitaxying 2D GaSe on an Si(111) substrate according to the invention.

Figure 3A:
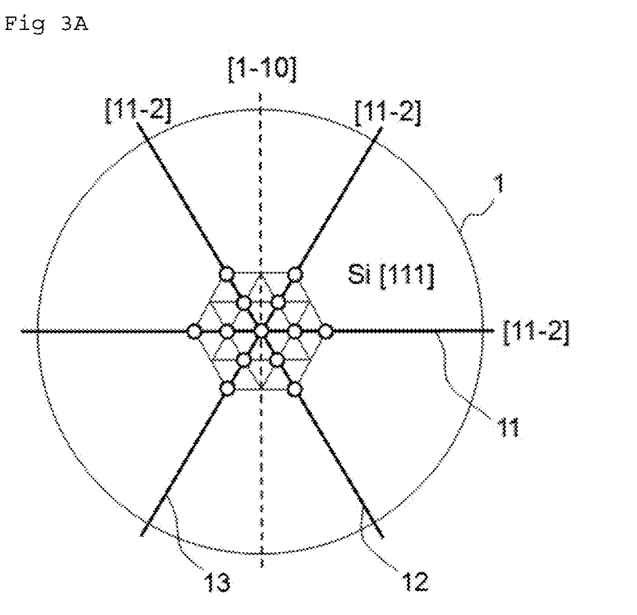
FIG. 3A-FIG. 3G show an exemplary process for epitaxying 2D GaSe on an Si(111) substrate according to the invention.

The first step of the process is a selection step which consists in selecting a [111]-oriented silicon substrate obtained from a silicon crystal bar 1 cut into slices according to cutting specifications suitable for obtaining a [111]-oriented silicon vicinal surface 2, which could also be called a vicinal Si(111) substrate.

More precisely, the vicinal Si(111) substrate is produced by cutting the silicon bar along a miscut direction 11, 12, 13 of the substrate which is precisely along one of the three equivalent [11-2] crystallographic directions. In other words, the silicon crystal is cut along one of the following azimuthal angles: 90°, 30° or −30° with respect to the [1-10] direction of the notch for the orientation of the crystal lattice of the substrate.

FIG. 3A illustrates the three equivalent [11-2] crystallographic directions in a top view of the Si(111) silicon crystal bar 1. The bar may for example be cut along direction 11 which corresponds to one of the three equivalent [11-2] crystallographic directions.

Figure 3B:
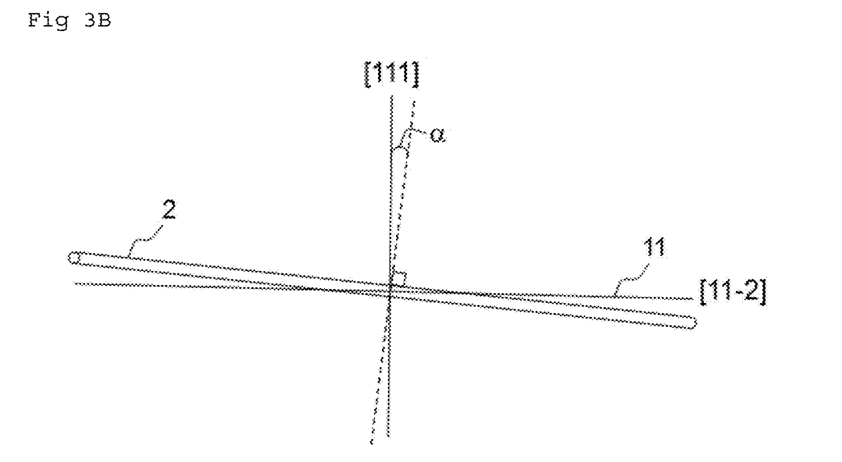

FIG. 3B illustrates the misorientation parameters. The misorientation of the crystal is defined by a miscut angle α, which defines the angle between the normal of the vicinal surface 2 and the [111] direction.

As mentioned in the disclosure of the invention, in a vicinal surface, the atoms are not distributed in a plane but are organized in a set of terraces and at least one step spaced apart by two terraces. The height of a step is a multiple of the distance between two successive planes of atoms. Thus, the vicinal surface 2 illustrated appears as a succession of terraces 21 and at least one step 22 between two terraces. The width L of the terraces corresponds to the dimension along the [11-2] crystallographic direction chosen for the cut. The height h of a step corresponds to the dimension along the [111] crystallographic direction.

The miscut angle α makes it possible to determine the width L of the terraces 21, using the following formula:

$$L = h/(\tan \alpha) \qquad \text{[Math1]}$$

where h is the height of the steps.

The height of a step is around 0.3 nm in the case of Si(111).

The misorientation of the crystal is also defined by the miscut direction which is one of the three [11-2] crystallographic directions, as mentioned above.

Additionally, to have wide terraces and therefore a low step density, the miscut angle is chosen so as to be smaller than or equal to 0.1°. A low step density favours a low density of nuclei, thus limiting the potential defects that may occur in the step of nucleation of the GaSe (dislocation in particular). The expression "low step density" is generally understood to mean a step for a terrace width of at least 200 nanometres.

An Si(111) substrate with a slightly misoriented vicinal surface is thus obtained, that is to say one with a miscut angle smaller than or equal to 0.1°.

After the selection step and before the treatment step described below, the process may comprise a step of removing oxide from the (111) silicon surface, for example using a wet treatment using hydrogen fluoride (HF) or using plasma in a Siconi™-type deoxidation chamber.

Figure 3C:
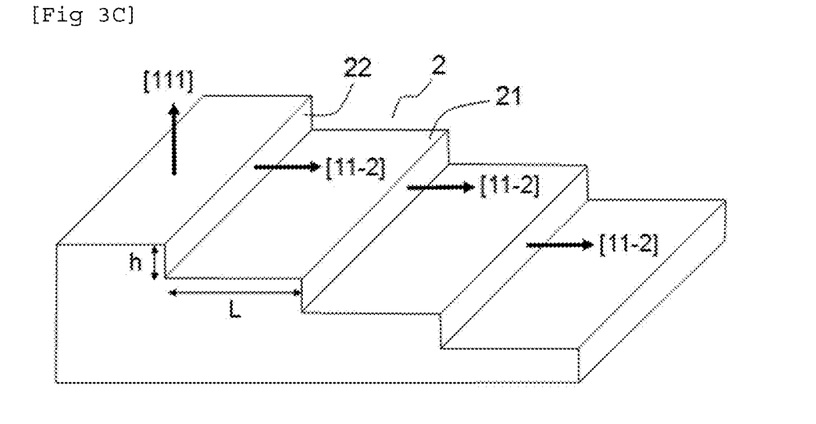

The second step of the process is a treatment step which consists of a treatment of the vicinal surface 2 obtained so as to flatten the [111]-oriented terraces 21. This allows the steps to be made to appear as precisely oriented in the [11-2] direction, as illustrated in FIG. 3C. This treatment step, carried out at high temperature, consists in surface-diffusing the silicon atoms until they reach their equilibrium position so as to reveal the lowest-energy [111]-oriented silicon planes. The residual roughness of the [111]-oriented terraces of the silicon substrate after cutting and chemical-mechanical polishing (CMP) is thus brought to a value close to zero.

This treatment step is typically carried out by introducing the substrate into an epitaxy chamber. A gas is introduced, for example hydrogen. Alternatively, it may be helium, argon or any other inert gas from column VIII of the periodic table.

The treatment step is generally carried out at between 800° C. at 1100° C.

The pressure in the chamber may come within a large range, for example between 1 mTorr and 750 Torr, or even between 1 mTorr and 600 Torr. Preferably, the pressure in the chamber is low, that is to say typically lower than 20 Torr, preferably lower than 10 Torr. A low pressure prevents the silicon from starting to be etched by the gas, in particular hydrogen, and thus it prevents the formation of pits in the surface of the silicon.

The treatment duration is generally between 5 and 30 minutes.

According to one particular exemplary embodiment, the conditions of the treatment step are:
  pressure in the chamber: 5-10 Torr;
  temperature: 900° C.;
  treatment duration: 10 minutes.

Figure 3D:
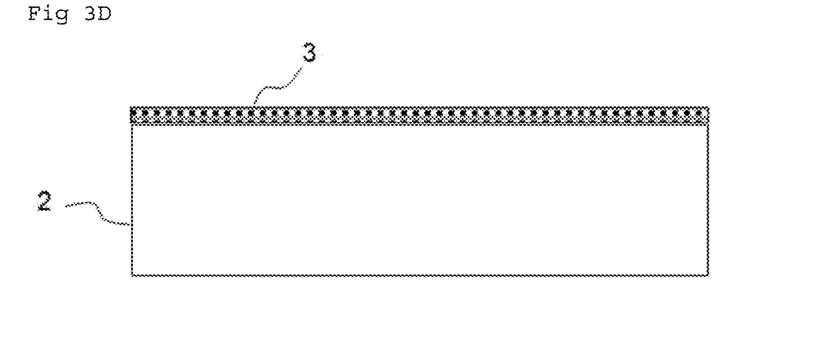

The third step of the process is a step of passivating the vicinal Si(111) surface, and this is done by depositing an atomic bilayer of gallium and of selenium, that is to say one atomic layer of gallium (Ga) and one atomic layer of selenium (Se), on the Si(111) surface. This makes it possible to obtain the formation of a passivated vicinal surface 3 of Si—Ga—Se, as illustrated in FIG. 3D. Specifically, the highly reactive Si—H hydrogen bonds at the surface of the Si(111) are replaced with Si—Ga—Se bonds that are stable to a high temperature (up to around 650-750° C.) and are electronically passivated, i.e. the valence layer of the atoms at the surface is full (the valence electrons are paired). This passivated surface, of very low energy, then allows the epitaxying of a 2D material without covalent bonds with the terraces 21 of the silicon substrate [111], as described further below.

The GaSe passivation bilayer formed of one atomic layer of Ga bonded to one atomic layer of Se also corresponds to a half-sheet of the 2D GaSe material, a sheet consisting of four atomic layers in the sequence Se—Ga—Ga—Se. 2D GaSe denotes gallium selenide structured as one or more sheets.

According to the invention, the expression "electronically passivated" surface, or "electronic passivation" of a surface, is understood to mean a surface that is chemically inert and stable even at a high temperature (up to around 650-750° C.) with atoms having a full valence layer. The expression "electronically saturated surface" may also be used.

To carry out this passivation step, the Si(111) substrate is kept in the epitaxy chamber and the half-sheet of GaSe is deposited using the deposition technique of metal-organic chemical vapour deposition (MOCVD). The MOCVD technique is performed by conveying metal-organic precursors into the epitaxy chamber via a vector gas.

To obtain the GaSe half-sheet using MOCVD, metal-organic precursors, which are typically trimethylgallium (TMGa) and diisopropyl selenide (DIPSe), which are gaseous at the temperature used in the process, are introduced into the chamber simultaneously. Alternatively, any other gallium precursor and/or any other selenium precursor may be used.

The vector gas is typically hydrogen. Alternatively, it may be nitrogen, or an inert gas from column VIII of the periodic table.

The passivation step is generally carried out at between 400° C. at 650° C.

The total pressure in the chamber depends on the equipment but values are typically between 5 and 200 Torr.

The partial pressure of the gallium precursor is generally between 1 and 200 mTorr.

The III/VI (group III precursor/group VI precursor) molar flux ratio is generally between 1 and 10.

The duration of the passivation step is generally between 2 and 30 seconds.

According to one particular exemplary embodiment, the conditions of the passivation step are:
total pressure in the chamber: 10-20 Torr;
partial pressure of TMGa: around 10 mTorr;
Se/Ga (VI/III) molar flux ratio: around 3-4;
temperature: 530-550° C.;
passivation duration t: between 2 and 5 seconds.

The half-sheet of GaSe for obtaining the passivation surface has a thickness of about 2 Å.

The MOCVD technique is advantageous because it allows good reproducibility, good uniformity on the substrate scale and high crystal growth speeds. It is therefore compatible with industrial applications.

Alternatively, it is possible to use other chemical vapour deposition (CVD) techniques such as plasma-enhanced chemical vapour deposition (PECVD), atomic layer deposition (ALD) or hydride vapour phase epitaxy (HVPE).

Alternatively again, it is possible to use the technique of molecular beam epitaxy (MBE) which consists in projecting one or more molecular beams towards the substrate in order to carry out epitaxial growth.

Figure 3E:
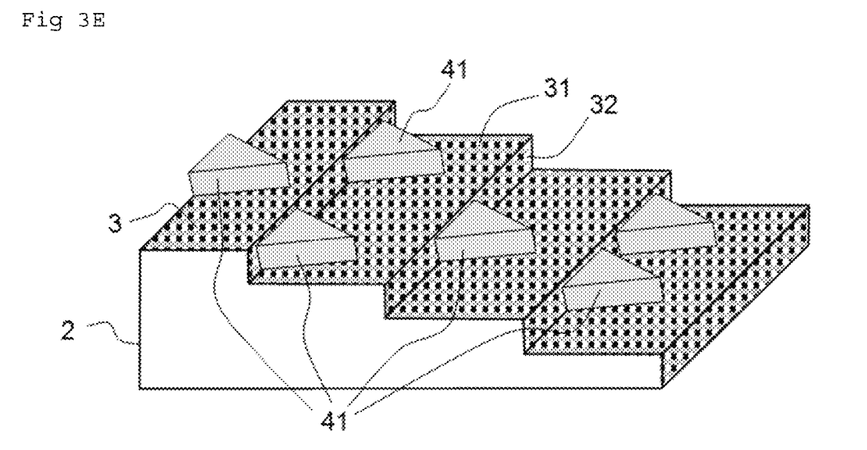

The fourth step of the process is a step of forming a layer of 2D GaSe on the passivated vicinal surface. It consists in growing GaSe two-dimensionally (in order to effectively obtain a layer of 2D GaSe) on the passivated surface 3. It thus consists of epitaxy which comprises a step of nucleation and a step of lateral growth from the nuclei until a continuous buffer layer is formed. The steps of nucleation and of lateral growth are described below.

The step of nucleation is carried out by depositing grains (or nuclei) 41 of GaSe on the passivation surface, as illustrated in FIG. 3E, and more precisely on the surface of a terrace against the step of this terrace. The nuclei 41 of GaSe have an initial width that is typically between 1 and 20 nanometres.

To carry out the nucleation, the substrate is kept in the growth chamber and the MOCVD technique is used. The precursors that may be used are the same as for the passivation step. The pressures employed are lower than those of the passivation step.

The vector gas is typically hydrogen. Alternatively, it may be nitrogen, helium, or any other inert gas from column VIII of the periodic table.

To promote nucleation against the steps rather than within the terraces, the partial pressure of the precursor (TMGa for example) is advantageously low or moderate (lower than or equal to 50 mTorr) in order to minimize encounters of the Ga and Se atoms with one another within the terraces instead of against the steps, and the temperature is high enough (at least 400° C. but preferably at least 500° C.) to allow the surface diffusion of the atoms to the steps.

Thus, the nucleation step is generally carried out at between 400° C. at 650° C.

The total pressure is adjusted according to the geometry of the chamber, but values are typically between 5 and 80 Torr.

The partial pressure of the gallium precursor is generally between 1 and 50 mTorr.

The VI/III molar flux ratio will depend on the type of precursor; values are typically between 3 and 4 Torr.

The duration of the nucleation step is generally between 2 and 30 seconds.

These conditions are thus chosen so as to promote the diffusion and the attachment of the Ga and Se atoms from the steps, which is the minimum-energy configuration. The growth of the 2D GaSe may thus be preferentially initiated from the steps instead of in an uncontrolled manner on the terraces, such as for example in the middle of the terraces.

During this nucleation step, the GaSe nuclei will align from the steps with a single orientation, and precisely with the [11-2] direction of the silicon surface aligned with the [11-20] direction of the GaSe ($[11\text{-}2]_{Si}//[11\text{-}20]_{GaSe}$).

According to one particular exemplary embodiment, the conditions of the nucleation step are as follows:
total pressure of the chamber: 5-20 Torr;
partial pressure of TMGa: around 2-3 mTorr;
Se/Ga (VI/III) molar flux ratio: around 3-4;
temperature: 530-550° C.;
nucleation duration: 2-15 seconds.

Figure 3F:
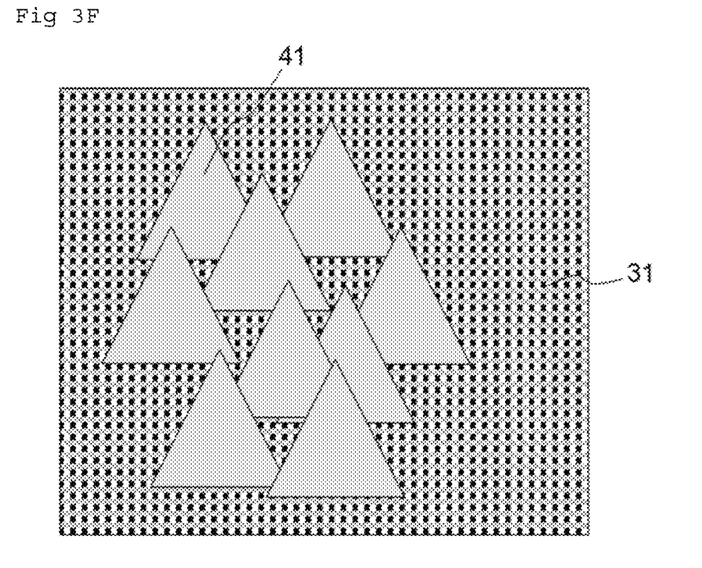
Figure 3G:
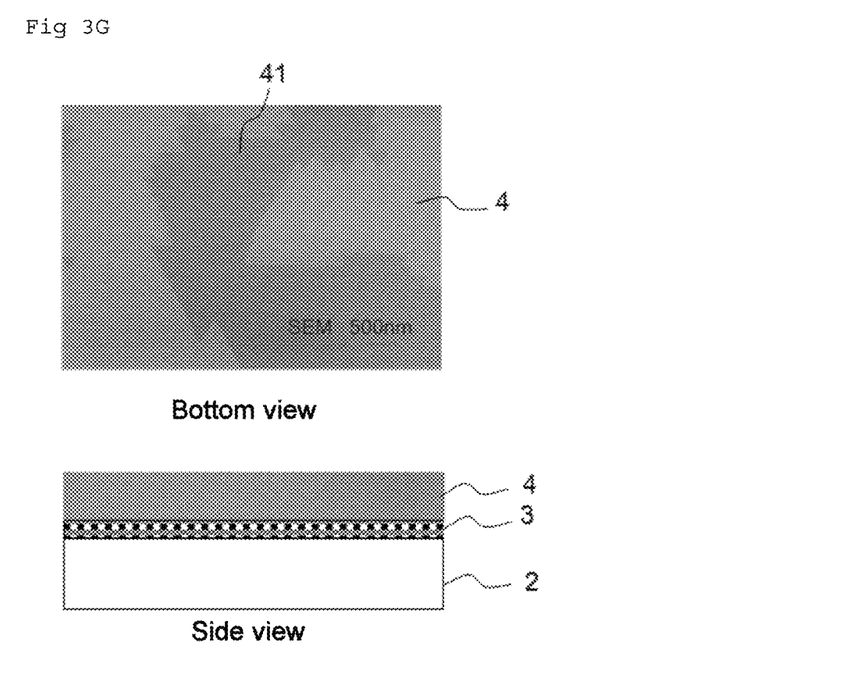

The step of lateral growth of the grains of GaSe consists in laterally growing, i.e. laterally with respect to the plane of the terrace on which the grains have been deposited, the grains 41 of GaSe deposited in the nucleation step, and to do so over several microns, as illustrated in FIGS. 3F and 3G, until the grains coalesce into a continuous layer 4, of single orientation without grain boundaries.

The step of lateral growth of the grains of GaSe is carried out at lower partial pressure and higher temperature than the nucleation step.

The substrate is kept in the growth chamber.

The lateral growth step is generally carried out at between 570° C. at 650° C.

The total pressure depends on the equipment used but values are typically between 5 and 80 Torr.

The partial pressure of the precursors is generally between 0.5 and 5 mTorr.

The VI/III molar flux ratio is generally between 3 and 4.

The duration of the lateral growth step is generally between 5 and 120 minutes.

According to one particular exemplary embodiment, the conditions of the growth step are as follows:
total pressure of the chamber: 5-20 Torr;
partial pressure of TMGa: around 1 mTorr;
Se/Ga (VI/III) molar flux ratio: around 3-4;
temperature: 600-640° C.;
growth duration: 1000-2000 seconds.

The process according to the invention makes it possible to carry out epitaxy by advancing from the steps of GeSe nuclei and thus obtain a layer of 2D GaSe of single orientation and without grain boundaries.

The structure formed by the process comprises:
a [111]-oriented silicon substrate, the surface of which is a passivated vicinal surface 3 exhibiting passivated terraces 31 and at least one passivated step 32 between two passivated terraces;
a layer 4 of 2D GaSe formed on the passivated terraces, and exhibiting a single orientation without antiphase boundaries.

The miscut angle $\alpha$ of the vicinal surface 3 of the [111]-oriented silicon substrate is smaller than or equal to 0.1°.

Preferably, the structure of the orientation of the GaSe with respect to the silicon surface is $([11-2]_{Si}/[11-20]_{GaSe})$.

The structure thus obtained is therefore of high crystal quality and allows its integration in electronic, optical, energy, etc. applications.

The process used may be on a large scale and with a high yield, thus making it compatible with use in the industry.

The layer of 2D GaSe formed may act as a buffer layer on which other 2D materials may be grown by van der Waals epitaxy, using for example the MOCVD technique. These other 2D materials may be for example chosen from other III-VI semiconductors such as InSe, GaS, GaTe, etc., or a combination of several III-VI materials, so as to obtain the band alignment corresponding to the type of component that is to be manufactured (photodetector, LED, MOSFET, TFET and generally all "more-than-Moore" components).

These additional layers may thus grow, in epitaxial relation with the layer of 2D GaSe, with a single orientation.

Instead of a 2D material, it may be a 3D material, which may be: a III-V material such as GaN, InGaN GaAs, GaSb or a combination of several III-V materials, a II-VI material such as CdHgTe or a combination of several II-VI materials, or a IV-IV material such as SiGe or Ge—Ge or a combination of several IV-IV materials.

Unless stated otherwise or obvious, the different embodiments may be combined. The present invention is not limited to the embodiments described above but rather extends to any embodiment that comes within the scope of the claims.

Among the numerous applications of the invention, mention may be made of microelectronics, photonics, sensors, radiofrequency-related technologies, micro-electromechanical systems (MEMS), components for the Internet of Things, battery chargers, high-voltage components, microprocessors, static and dynamic memory, photovoltaics and more broadly anything to do with "more-than-Moore" technologies or what are referred to as "derivative" technologies, that is to say technologies which incorporate several functions on a single silicon chip.

The invention claimed is:

1. A process for epitaxying GaSe on a [111]-oriented silicon substrate, comprising:
a step of selecting a [111]-oriented silicon substrate, said substrate resulting from cutting a silicon bar in a miscut direction which is one of the three [11-2] crystallographic directions, the miscut angle ($\alpha$) being smaller than or equal to 0.1°, the obtained surface of the substrate forming a vicinal surface exhibiting a plurality of terraces and at least one step between two terraces;
a passivation step consisting of depositing an atomic bilayer of gallium and of selenium on the vicinal surface of the silicon substrate so as to form a passivated vicinal surface made of silicon-gallium-selenium (Si—Ga—Se), said passivated vicinal surface exhibiting a plurality of passivated terraces and at least one passivated step between two passivated terraces;
a step of forming a layer of two-dimensional GaSe by epitaxy on the passivated surface, said formation step comprising a step of nucleation from each passivated step and a step of lateral growth on the passivated terraces from the nuclei obtained in the nucleation step.

2. The process according to claim 1, further comprising a step of treating the vicinal surface so as to flatten the terraces of said vicinal surface until a substantially zero roughness is obtained on the terraces, said treatment step being carried out after the substrate selection step and before the passivation step.

3. The process according to claim 2, the treatment step consisting of heat-treating the silicon substrate at high temperature, preferably higher than 800° C.

4. The process according to claim 1, the passivation step consisting of metal-organic chemical vapour deposition (MOCVD) with metal-organic precursors.

5. The process according to claim 4, the metal-organic precursors being trimethylgallium (TMGa) and diisopropyl selenide (DIPSe), the partial pressure of TMGa preferably being between 1 and 200 mTorr.

6. The process according to claim 4, the passivation step being carried out at a temperature of between 400 and 650° C., and for a duration of between 2 and 30 seconds.

7. The process according to claim 1, the nucleation step consisting of metal-organic chemical vapour deposition with metal-organic precursors, the partial pressure of the gallium precursor being lower than or equal to 50 mTorr.

8. The process according to claim 7, the nucleation step being carried out at a temperature of between 400 and 650° C.

9. The process according to claim 7, the nucleation step being carried out for a duration of between 2 and 30 seconds.

10. The process according to claim 1, the lateral growth step consisting of metal-organic chemical vapour deposition with metal-organic precursors, the partial pressure of the gallium precursor being between 0.5 and 5 mTorr.

11. The process according to claim 10, the lateral growth step being carried out at a temperature of between 570 and 650° C.

12. The process according to claim 1, further comprising a step of removing the oxide from the vicinal surface, said deoxidation step being carried out after the substrate selection step and before the passivation step.

13. The process according to claim 1, further comprising an additional step of epitaxying at least one 2D material other than 2D GaSe or at least one 3D semiconductor material, said additional step of epitaxy being formed on the layer of 2D GaSe.

14. A method according to claim 13, the at least one 2D material other than 2D GaSe or the at least one 3D material being chosen from the III-VI materials such as InSe, GaS, GaTe or a combination of III-VI materials, the III-V materials such as GaN, InGaN, GaAs, GaSb or a combination of III-V materials, the II-VI materials such as CdHgTe or a combination of II-VI materials, or the IV-IV materials such as SiGe or Ge—Ge or a combination of IV-IV materials.

15. A structure obtained by means of the process for epitaxying GaSe on a [111]-oriented silicon substrate according to claim 1, comprising:
- a [111]-oriented silicon substrate, the surface of which is a passivated vicinal surface exhibiting passivated terraces and at least one passivated step between two passivated terraces, the miscut angle ($\alpha$) of the vicinal surface being smaller than or equal to $0.1°$;
- a layer of 2D GaSe formed on the passivated terraces, and exhibiting a single orientation without antiphase boundaries.

* * * * *